United States Patent [19]

Jain et al.

[11] Patent Number: 4,516,832

[45] Date of Patent: May 14, 1985

[54] APPARATUS FOR TRANSFORMATION OF A COLLIMATED BEAM INTO A SOURCE OF REQUIRED SHAPE AND NUMERICAL APERTURE

[75] Inventors: Kantilal Jain; Milton R. Latta, both of San Jose, Calif.

[73] Assignee: International Business Machines Corporation, Armonk, N.Y.

[21] Appl. No.: 391,099

[22] Filed: Jun. 23, 1982

[51] Int. Cl.³ ............................................. G02B 5/14
[52] U.S. Cl. ........................ 350/96.24; 350/3.72; 350/96.18; 350/167
[58] Field of Search ............... 350/96.18, 96.24, 3.72, 350/3.73, 96.25, 167, 169, 3.75

[56] References Cited

U.S. PATENT DOCUMENTS

| | | | |
|---|---|---|---|
| 3,547,546 | 12/1970 | Schier | 350/167 X |
| 3,556,636 | 1/1971 | Roberts et al. | 350/96 |
| 3,716,287 | 2/1973 | Brooks | 350/167 X |
| 3,753,607 | 8/1973 | Kitano et al. | 350/96.25 |
| 3,827,075 | 7/1974 | Baycura | 350/96.24 X |
| 4,076,978 | 2/1978 | Brennan et al. | 250/213 VT |
| 4,156,555 | 5/1979 | McMahon | 350/3.75 |
| 4,345,833 | 8/1982 | Siegmund | 350/96.31 X |
| 4,409,477 | 10/1983 | Carl | 350/96.24 X |

*Primary Examiner*—William L. Sikes
*Assistant Examiner*—Akm E. Ullah
*Attorney, Agent, or Firm*—Otto Schmid, Jr.

[57] ABSTRACT

A laser light source for a high resolution projection lithography system and transforming optical apparatus which transforms the laser light into an optically equivalent self-luminous curved line source. The transforming optical apparatus comprises a two-dimensional array of fly's eye lenses positioned to intercept light from the light source and to produce a series of point sources having a selected numerical aperture. An optical fiber array is positioned so that the imput end of each fiber receives the light output from one of the lenses in the array. The position of the fibers is chosen so that light from the lenses underfills the fibers to preserve the numerical aperture. The output ends of the fibers are arranged in position to produce a curved line source of a desired shape. Alternate embodiments are described in which lens arrays can be selectively positioned to change the numerical aperture of the transforming optical apparatus.

17 Claims, 10 Drawing Figures

4,516,832

APPARATUS FOR TRANSFORMATION OF A COLLIMATED BEAM INTO A SOURCE OF REQUIRED SHAPE AND NUMERICAL APERTURE

DESCRIPTION

BACKGROUND OF THE INVENTION

1. Field of the Invention

This invention relates to optical imaging systems and specifically concerns an optical system for transforming a collimated light beam into a self-luminous source of arbitrary shape and numerical aperture.

2. Description of the Prior Art

The drive toward higher density circuitry in microelectronic devices has promoted interest in a variety of high resolution lithographic techniques which require the ability to produce finer resolution patterns at high production rates. In optical lithography, the improvement in resolution that results by use of shorter wavelengths is well known. As a result of these considerations, an effort has been made to develop processes and materials which require exposure in the deep UV spectral region. The light source traditionally used in these prior art systems has been either a deuterium lamp or a xenon-mercury arc lamp. The problem with using such lamps is that insufficient power is available from them in the desired spectral region. For a typical lamp in a typical system, the total deep UV power that can be collected for use is in the few tens of milliwatts range, so that the exposure time for resists that are sensitive in the deep UV are typically several minutes.

In the prior art systems, an aperture stop is provided so that, by varying the size of the aperture, the cone angle of illumination is varied and, thus, the degree of partial coherence and accompanying edge resolution are also varied. However, since the aperture stop also limits the total amount of light entering the projection system, longer exposure times are required to achieve the enhanced edge resolution.

SUMMARY OF THE INVENTION

It is, therefore, the principal object of this invention to provide an optical system for transforming a collimated light source into a self-luminous source of arbitrary shape and numerical aperture.

Briefly, according to the invention, there is provided apparatus for producing a source of a desired shape from a collimated light source comprising means for directing a collimated light source along a predetermined path, means to position a lens array along the predetermined path so that the collimated light beam impinges on the lens array to form a plurality of point sources having a predetermined numerical aperture, and an optical fiber array positioned so that the input end of each of the optical fibers is positioned to receive the light from a different one of the lenses within the lens array and the output ends of the optical fibers are positioned to produce a self-luminous source of the desired shape and numerical aperture.

DESCRIPTION OF THE PREFERRED EMBODIMENTS

Figure 1:
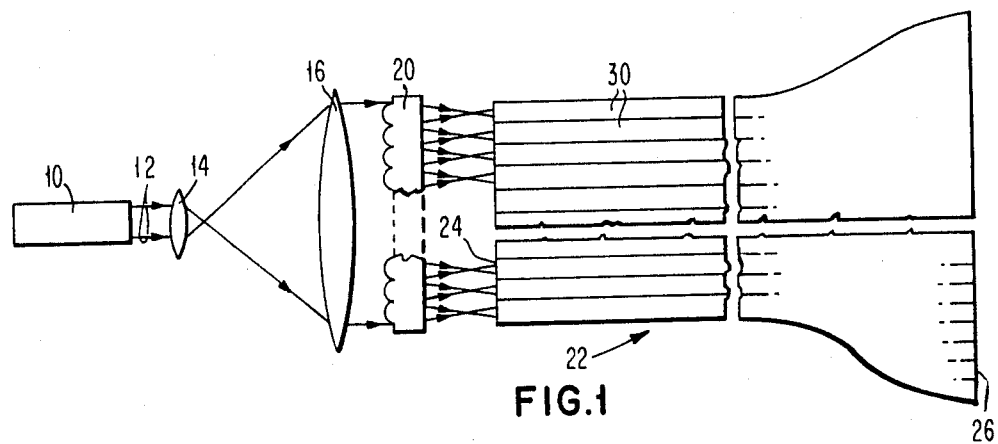
FIG. 1 is a diagrammatic schematic view of the optical system for practicing the preferred embodiment of the present invention.
Figure 5:
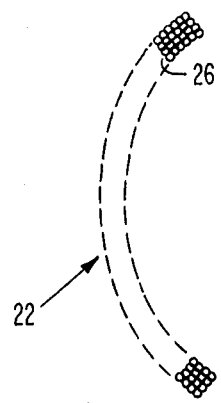
FIG. 5 is an end view of the output face of the fiber optic array of FIG. 1.

In the specific embodiment of the invention shown in FIG. 1, the optical system utilizes light from a suitable source such as laser 10 which, in the preferred embodiment, is an excimer laser. The excimer laser produces a nearly rectangular shaped, nearly collimated output beam 12. The beam 12 is then altered in its rectangular shape by a cylindrical (or anamorphic) telescope comprising lenses 14 and 16 which will alter the beam size while maintaining collimation. The beam is then incident on a fly's eye lens array 20 which forms a plurality of focused spots having a selected numerical aperture. Following lens array 20 is a shaped fiber optic array 22 which is shaped to a rectangular configuration on the input face 24 to accept the focused beams from lens array 20. The fiber optic array is shaped to any desired shape at the output face 26. In the specific embodiment (FIG. 5), the array 22 is shaped to match the requirements of a prior art photolithography projection tool, the output faces 26 of the fiber optic array 22 are arranged in an arc to match the light input to the projection tool.

Figure 2:
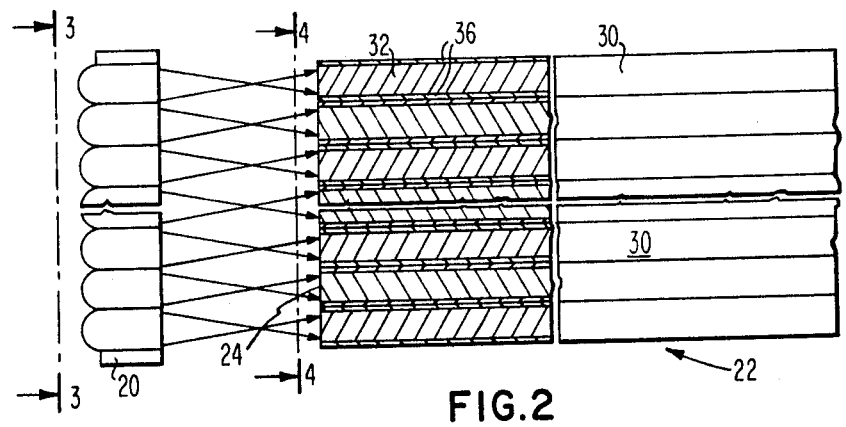
FIG. 2 is a more detailed view, partially in section of the fly's eye lens array and the fiber optic array of FIG. 1.
Figures 3A, 3B, 4:
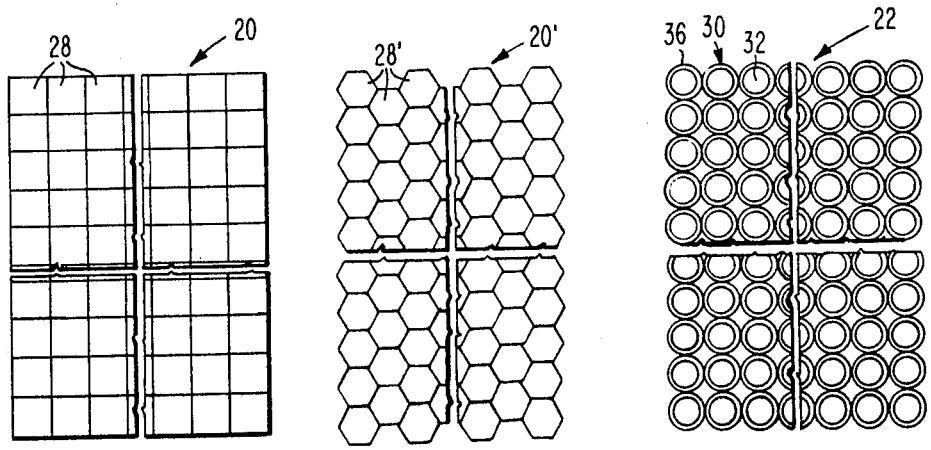
FIG. 3a is a section view along lines 3—3 of FIG. 2.
FIG. 3b is an end view of an alternate embodiment of the lens array 20.
FIG. 4 is a section view along lines 4—4 of FIG. 2.

The relationship of the fly's eye lens array 20 (FIG. 1) and the fiber optic array 22 (FIG. 1) is shown in greater detail in FIG. 2. The rectangular light beam from laser 10 as modified by the lenses 14 and 16 substantially fills the fly's eye lens array 20. The lens array 20 (see FIG. 3a) comprises an array of square cross-section lenses 28 to avoid the loss in efficiency caused by the less than 100% packing density of circular lens elements. An alternate lens array 20' is shown in FIG. 3b as an array of hexagonal cross-section lens 28'. The numerical aperture of the lenses 28 comprising the array 20 (or lenses 28' comprising the array 20') is chosen so that the core 32 (FIG. 4) of the individual fibers 30 comprising fiber optic array 22 are underfilled. As shown in FIG. 4, the underfilling illuminates less than 100% of the fiber core 34 so that no light is lost due to impingement on the fiber cladding 36. The divergence (numerical aperture) at the output face 26 (FIG. 1) of the fiber 30 is maintained by the fiber to be the same as the numerical aperture of the lens elements 28 in the fly's eye lens array 20. Due to the multiple internal reflections which occur along the length of the fibers 30 and the overlap between the light distribution from different fibers, the distribution at the output face 26 of the fiber array 22 behaves as a self-luminous source, that is, a continuous assemblage of radiating centers each emitting into a well defined numerical aperture.

It will be apparent that the use of the shaped fiber array allows a great flexibility since the fibers may be redistributed to virtually any desired configuration on the output face to suit a particular need, either semicircular, elliptical, parabolic or arbitrary, for example. The configuration shown in FIG. 5 permits an excimer laser to be used as the light source for an existing photolithography projection tool. The result is exposure time about two orders of magnitude faster than the exposure time required for the tool as designed. This change permits a greatly increased production rate for such applications.

Figure 6:
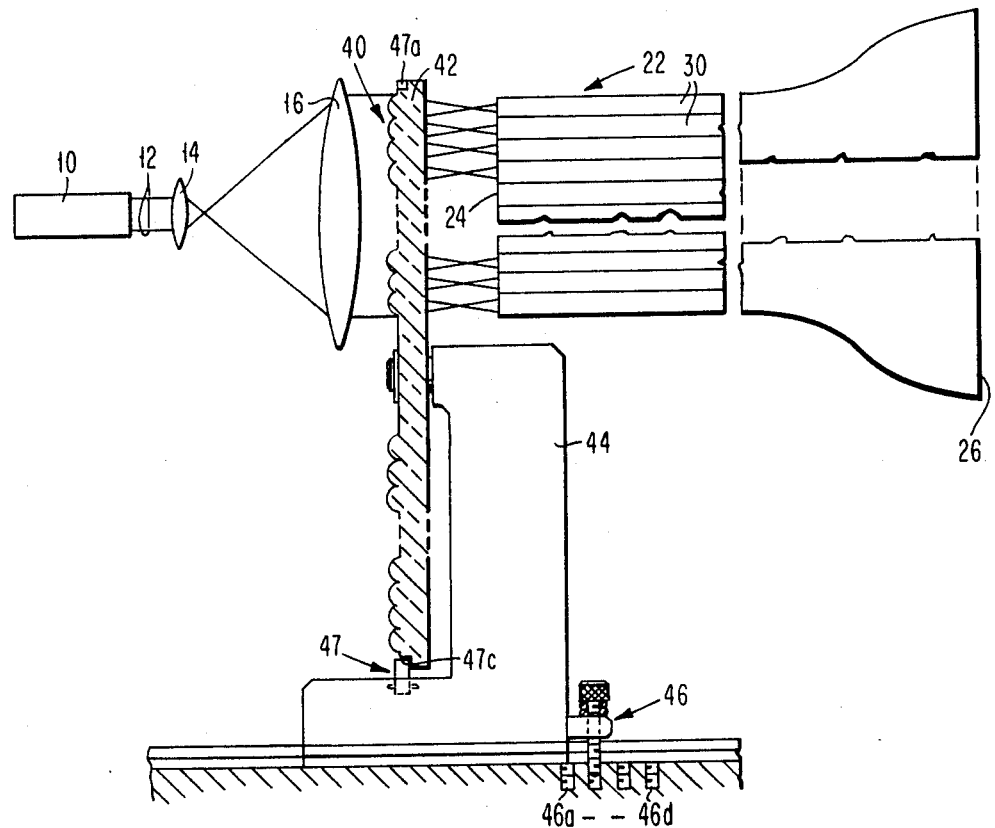
FIG. 6 is a diagrammatic showing of the specific embodiment of the present invention in which a plurality of fly's eye lens arrays are mounted for selective operation to adjust the numerical aperture.

In the embodiment of the invention shown in FIG. 6, a plurality of lens arrays 40 are mounted on a disk 42 which is supported by a suitable frame member 44 so that disk 42 can be rotated to a plurality of indexable positions. The lens arrays 40 each comprise an array of fly's eye lenses similar in construction to the fly's eye lens array 20. However, the focal length of each of the lenses in arrays 40 is different from the lenses in each of the other arrays 40a–40d (FIG. 7) so that by proper placement, the selected lens arrays 40a–40d produce a selected numerical aperture incident into the fiber optic array. Frame member 44 is selectively movable laterally with respect to the input faces 24 of the fiber array 22 to a plurality of positions. The lateral position of frame member 44 is adjusted by detent mechanism 46 which selectively positions frame member 44 relative to machine frame 48, and a detent notch 46a–46d is provided for each of the lateral positions. A second detent mechanism 47 is provided which is operable in conjunction with detent notches 47a–47d to lock disk 42 into one of its radial positions to move the selected one of the lens arrays 40a–40d to the operative position. By this mechanism, a particular lens array 40 and detent position is provided for each of the numerical apertures required for the projection tool. The selection can be by any suitable mechanical, electrical or electromechanical means.

Table I is provided below to show one specific embodiment of a series of lens arrays suitable for use in a particular projection tool.

TABLE I

| Lens Array | Detent Position | f no. | NA |
|---|---|---|---|
| 40a | 46a | 3.5 | .14 |
| 40b | 46b | 4.2 | .12 |
| 40c | 46c | 5.8 | .09 |
| 40d | 46d | 8.1 | .06 |

Figure 8:
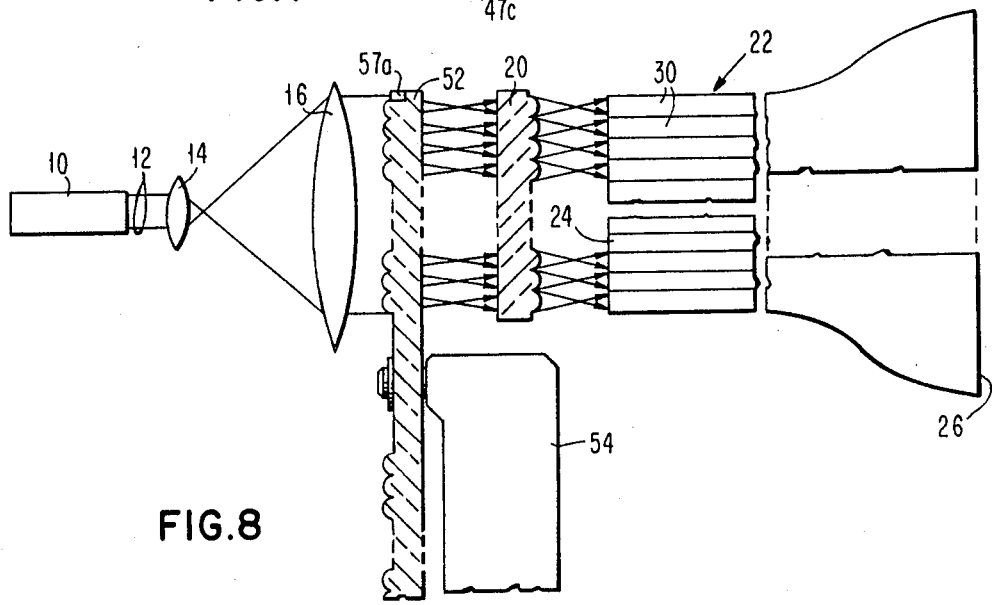
FIG. 8 is a diagrammatic showing of an alternate embodiment of the present invention in which a stationary fly's eye lens array is used in combination with a plurality of fly's eye lens arrays in a selective operation to adjust the numerical aperture.
Figure 9:
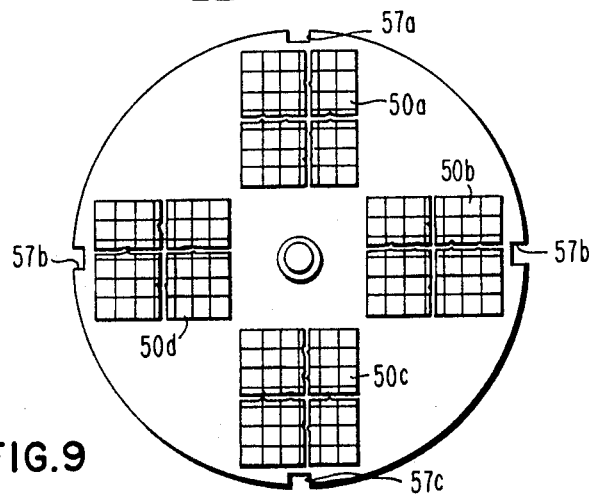
FIG. 9 is a plan view of the rotating disk of FIG. 8.

Another embodiment for selecting a particular numerical aperture for the projection tool is shown in FIG. 8. In this embodiment, the lens array 20 is used together with a plurality of lenses 50 mounted on a disk 52 which is supported by a suitable frame member 54 so that disk 52 can be rotated to a plurality of indexable positions. In this embodiment, the desired numerical aperture is provided by the combination of one of the arrays 50 and the array 20. Detent mechanism 56 may be provided to laterally position frame member 54.

A further embodiment utilizes the lens array 20 and a plurality of lenses mounted on a disk which is supported by a suitable frame member so that disk can be rotated to a plurality of indexable positions. The lenses in this embodiment each comprise a spherical lens instead of the array 40 or 50. Each lens has a different focal length so that, by proper placement, the selected lens along with the fly's eye lens array produces a selected numerical aperture into the fiber optic array. A detent mechanism may be provided to laterally position the frame member if desired. In this embodiment, the input fiber faces may also be adjustable in order to align them with the axes of the lens array 20.

Figure 7:
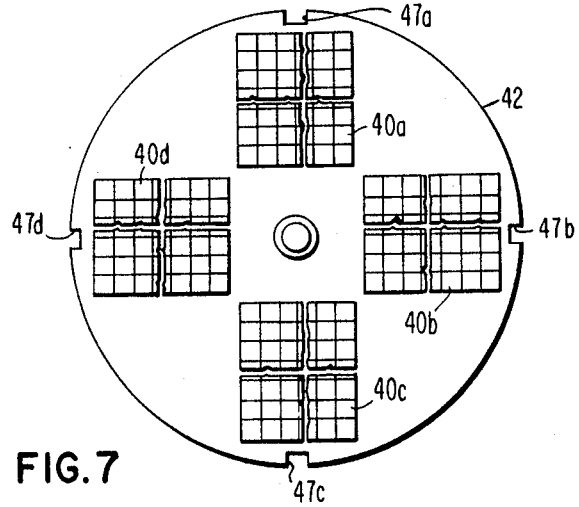
FIG. 7 is a plan view of the rotating disk of FIG. 6.

Each of the embodiments shown in FIGS. 6, 7 and 8 provide a projection lithography tool with a selectively variable numerical aperture without substantial change in the total light into the projection tool. Thus, this apparatus produces the advantage of a system in which light throughput and cone angle of illumination (numerical aperture) are independent which avoids having a trade-off between edge resolution and exposure time.

While the invention has been particularly shown and described with reference to a preferred embodiment thereof, it will be understood by those skilled in the art that various changes in the form and details may be made therein without departing from the spirit and scope of the invention.

Having thus described our invention, what we claim as new and desire to secure by Letters Patent is:

1. Apparatus for producing a line source of a predetermined shape and numerical aperture from a collimated light source comprising:
   first optical means for directing a collimated light source along a predetermined path;
   second optical means fixed in position along said predetermined path so that said light source impinges upon said second optical means, said second optical means comprising a two dimensional lens array having multiple lenses in each of said two dimensions, said light source simultaneously impinging on all of the lenses of said lens array to form a plurality of sources having a predetermined numerical aperture;
   an optical fiber array, said fiber array having the input end of each of the fibers of said array positioned to receive the light from a different one of the lenses of said lens array to produce a plurality of self-luminous sources; and
   means for positioning the other end of each of said optical fibers to produce a self-luminous source of said predetermined shape and numerical aperture.

2. The apparatus of claim 1 wherein said predetermined shape comprises an arc of a circle.

3. The apparatus of claim 1 wherein said second optical means comprises a two-dimensional array of fly's eye lenses.

4. The apparatus of claim 3 wherein each of the lenses in said array of fly's eye lenses has a square cross-section.

5. The apparatus of claim 3 wherein each of the lenses in said array of fly's eye lenses has a hexagonal cross-section.

6. Apparatus for producing a source of a predetermined shape and numerical aperture from a collimated light source comprising:
   first optical means for directing a beam from a collimated light source along a predetermined path;
   second optical means fixed in position along said predetermined path so that said beam impinges upon said second optical means, said second optical means comprising a plurality of lens array means, each of said lens array means comprising a two dimensional lens array having multiple lenses in each of said two dimensions, the lenses of each of said lens array means having a focal length that is different from the focal length of the others of said plurality of lens array means, and means for moving a selected one of said lens array means into the path of said beam so that said beam simultaneously impinges on all the lenses of said selected lens array to form a plurality of sources having a predetermined numerical aperture;

an optical fiber array, said fiber array having the input end of each of the fibers of said array positioned to receive the light from a different one of the lenses of said lens array to produce a plurality of self-luminous sources; and means for positioning the other end of each of said optical fibers to produce a self-luminous source of said predetermined shape and numerical aperture.

7. The apparatus of claim 6 wherein said predetermined shape comprises an arc of a circle.

8. The apparatus of claim 6 wherein each of said lens array means of said second optical means comprises a two-dimensional array of fly's eye lenses.

9. The apparatus of claim 8 wherein each of the lenses in said array of fly's eye lenses has a square cross-section.

10. The apparatus of claim 8 wherein each of the lenses in said array of fly's eye lenses has a hexagonal cross-section.

11. Apparatus for producing a source of a predetermined shape and numerical aperture from a collimated light source comprising:

first optical means for directing a collimated light source along a predetermined path;

second optical means fixed in position along said predetermined path so that said light source impinges upon said second optical means, said second optical means comprising a lens array to form a plurality of sources having a predetermined numerical aperture;

third optical means positioned between said first and said second optical means, said third optical means comprising a plurality of lens means each having a different focal length and means for moving a selected one of said lens means of said third optical means into said predetermined path so that said second optical means and said selected lens means of said third optical means produces a selected numerical aperture; and an optical fiber array, said fiber array having the input end of each of the fibers of said array positioned to receive the light from a different one of the lenses of said lens array, and means for positioning the other end of each of said optical fibers to produce a self-luminous source of said predetermined shape and numerical aperture.

12. The apparatus of claim 11 wherein said predetermined shape comprises an arc of a circle.

13. The apparatus of claim 11 wherein each of said lens means comprising said third optical means is a two-dimensional fly's eye lens array.

14. The apparatus of claim 13 wherein each of the lenses in said array of fly's eye lenses has a square cross-section.

15. The apparatus of claim 13 wherein each of the lenses in said array of fly's eye lenses has a hexagonal cross-section.

16. The apparatus of claim 11 wherein said lens array comprising said second optical means is a two-dimensional fly's eye lens array.

17. The apparatus of claim 11 wherein each of said lens means comprising said third optical means is a spherical lens.

* * * * *